(12) United States Patent
Pahl et al.

(10) Patent No.: US 8,611,566 B2
(45) Date of Patent: Dec. 17, 2013

(54) MEMS-MICROPHONE

(75) Inventors: Wolfgang Pahl, Munich (DE); Anton Leidl, Hohenbrunn (DE); Matthias Jungkunz, Munich (DE); Andreas Beer, Schoenthal (DE)

(73) Assignee: Epcos AG, Munich (DE)

( * ) Notice: Subject to any disclaimer, the term of this patent is extended or adjusted under 35 U.S.C. 154(b) by 251 days.

(21) Appl. No.: 13/037,503

(22) Filed: Mar. 1, 2011

(65) Prior Publication Data

US 2012/0224726 A1 Sep. 6, 2012

(51) Int. Cl.
*H04R 25/00* (2006.01)

(52) U.S. Cl.
USPC .......... 381/174; 381/175; 381/111; 381/361; 324/686

(58) Field of Classification Search
USPC ............... 381/174, 175, 111, 361; 257/415; 324/686
See application file for complete search history.

(56) References Cited

U.S. PATENT DOCUMENTS

| | | | |
|---|---|---|---|
| 7,923,791 B2 * | 4/2011 | Huang et al. | 257/415 |
| 8,295,512 B2 * | 10/2012 | Deruginsky et al. | 381/113 |
| 8,295,515 B2 * | 10/2012 | Kuratani et al. | 381/175 |
| 2008/0042223 A1 * | 2/2008 | Liao et al. | 257/415 |
| 2008/0164888 A1 * | 7/2008 | Suzuki et al. | 324/686 |
| 2009/0001553 A1 | 1/2009 | Pahl et al. | |
| 2012/0189144 A1 * | 7/2012 | Delaus et al. | 381/174 |

\* cited by examiner

*Primary Examiner* — Curtis Kuntz
*Assistant Examiner* — Joshua Kaufman
(74) *Attorney, Agent, or Firm* — Nixon Peabody LLP

(57) ABSTRACT

A MEMS microphone having an improved noise performance due to reduced DC leakage current is provided. For that, a minimum distance between a signal line of the MEMS microphone and other conducting structures is maintained. Further, a DC guard structure fencing at least a section of the signal line is provided.

19 Claims, 3 Drawing Sheets

MEMS-MICROPHONE

FIELD OF THE INVENTION

The present invention relates to MEMS-Microphones.

BACKGROUND OF THE INVENTION

The current trend towards miniaturization, e.g. of MEMS microphones (MEMS=micro-electromechanical system), demands for smaller electric or mechanic or electromechanical devices. In general, MEMS microphones comprise a flexible or movable membrane and a rigid back plate. The membrane and the back plate act as electrodes of a capacitor. The influence of received sound and its respective air pressure changes result in a changing capacity of such a MEMS capacitor. In MEMS microphones, this changing capacity is converted into an electrical signal by means of an applied DC bias voltage in the range of 10 V.

The area of respective capacitor electrodes provides a capacity in the range of 1 pF. As an effect of the miniaturization, the respective electric signal levels are relatively weak. For that, a signal amplifier such as a low noise amplifier with a very high input impedance is needed. The impedance of the input side of the signal amplifier is typically in the range of 1 TΩ.

From U.S. Published Application No. 2009/0001553 A1, MEMS microphones are known.

What is needed is a low noise MEMS microphone that is producible in a cost-efficient manner especially on low-cost substrates.

BRIEF SUMMARY OF THE INVENTION

It is therefore an object of the present invention to provide a low noise MEMS microphone that can be produced in a cost-efficient manner and that is compatible with current production technologies and means for miniaturization.

The independent claims provide such microphones. Dependent claims provide advantageous embodiments.

In a first variant, a MEMS microphone is proposed that comprises a MEMS transducer having a signal output, an integrated circuit (IC) chip having a signal input, a substrate, a signal line, and a conducting structure. The MEMS transducer and the IC chip are arranged on the substrate. The signal line electrically connects the signal output of the MEMS transducer with a signal input of the IC chip. The conducting structure is electrically connected to the MEMS transducer, to the IC chip or to a reference potential of the circuit (e.g. ground) or, in general, to a potential different from the direct current (DC) bias voltage. A minimum distance between the signal line and the conducting structure is kept of at least 200 µm or, even better, at least 500 µm in order to reduce a DC leakage current flowing through the insulation resistance driven by a potential difference $U_{bias}$ between a membrane potential and ground.

It was found that the design of the signal line requires special care. The signal line mainly is the connection between high impedance MEMS output and high impedance amplifier input. The following methods can be applied to improving the signal line:

Method 1: The MEMS, amplifier and said signal line are integrated on a common chip. As a consequence, the signal line can be made very short and insulated in a high quality dielectric material like oxides or nitrides. However, very complex processing steps are necessary for this method which results in high costs and a relatively low yield.

Method 2: The MEMS and amplifier are embodied as two separate chips, which are mounted side by side on a common carrier substrate. The terminals on both chips face away from the substrate and are interconnected by means of a chip-to-chip bond wire extending through the air, the latter being also an excellent dielectric. But such wire bond loops require a certain headroom above the chips, and the remaining connections such as a power supply from chip to substrate occupy landing area beside the chip. Thus, the achievable miniaturization is limited with this method.

Method 3: The MEMS and amplifier are embodied as two separate chips, these being flip-chip mounted onto a common carrier substrate, the terminals facing toward the substrate and being interconnected through conductive structures on or in this substrate. This method provides high design flexibility, miniaturization and most economic processing, but may be jeopardised by the dielectric properties of the substrate resulting in an insufficient insulation resistance.

In general, any high impedance input of a highly sensitive amplifier is prone to thermal noise originating from statistical movement of charge carriers.

The inventors found that—in case of the MEMS microphone circuit—a significant additional source of noise is the DC current flowing through the insulation resistance driven by a potential difference between a membrane potential and ground $U_{bias}$, resulting in a noise voltage signal superimposing the transducer signal. The cause is the discrete nature of charge transport of a DC leakage current.

In particular, it was found that flip-chip assembly of MEMS microphones and dedicated amplifiers on low-cost standard organic multilayer laminates (e.g. "FR-4" as specified by the National Electrical Manufacturers Association and the like), although suitable for most demanding electronic applications, suffer from increased noise level due to this cause.

Thus, in addition to the above mentioned methods the following features for improving the signal quality of a MEMS device are possible:

The MEMS transducer can comprise the constituent elements of the MEMS microphone such as the flexible or movable membrane, the back plate or a back volume.

The IC chip can comprise electronic circuits for processing or establishing an electrical signal that provides the respective received acoustic information. The IC chip can comprise a signal amplifier such as a low noise amplifier and a DC bias voltage source for a DC bias voltage between the flexible or movable membrane and the back plate of the MEMS transducer. Further, the IC chip can comprise an analog-to-digital converter. Then, the acoustic information can be provided at a digital port of the IC chip.

Further, the IC chip can comprise a charge pump for establishing the DC bias voltage.

The MEMS transducer and the IC chip can be arranged one next to the other on the substrate.

Further, it was found that substrates having a high resistivity allow good electrical insulation of the signal line. The signal line is responsible for propagating a very small AC voltage signal from the MEMS transducer to the IC chip. A good electrical isolation of the signal line is therefore crucial for a good MEMS microphone.

However, substrates of high resistivity are expensive and need a careful handling for sustaining their high resistivity. Members of this group of substrates are notably inorganic materials such as ceramic (HTCC=High Temperature Cofired Ceramics or LTCC=Low Temperature Cofired Ceramics) and glass, but also fluorinated polymers like PTFE (polytetrafluoroethylene). In order to provide MEMS microphones that are produceable in a cost-efficient manner, it is preferred to use cheaper substrates. However, the use of cheaper substrates demands for further means for sustaining a good MEMS microphone. Said cheaper substrates, in particular organic materials like epoxy-based laminates suffer from water absorption on their surfaces and in their volume, both degrading the achievable insulation resistance. Especially, surface effects are crucial.

It was further found that enhancing the spatial isolation of the signal line from its surroundings improves the electrical insulation of the signal line and is advantageous despite the trend to miniaturization.

The conducting structure can be any conducting structure such as a grounding structure or a further signal line.

In one embodiment of the first variant, the distance between the signal line and the conducting structure is at least 500 µm.

In one embodiment, the conducting structure comprises an area having a recess in the vicinity of the signal line for maintaining a minimum distance between the conducting structure and the signal line.

It is possible to cover large areas with a conducting material in order to achieve good RF shielding of the respective MEMS microphone. However, the respective distance between the shielding structure which is a conducting structure and the signal line must be maintained.

In one embodiment, the MEMS microphone's circuit has an electromagnetic shielding potential and the conducting structure serves as electromagnetic shield and is electrically connected to the shielding potential.

The shielding potential can be a ground potential of the MEMS microphone's circuit or any other constant potential with low source impedance.

The electromagnetic shield connected to shielding potential can protect sensitive signal structures from external interference signals.

In one embodiment, the MEMS microphone further comprises a bump connection BU between the substrate and the MEMS transducer or between the substrate and the IC chip. The bump connection BU may form a part of the signal line. The distance between the bump connection BU or other parts of the signal line and other conducting structures arranged on or in the substrate is at least 200 µm, more preferably at least 500 µm.

The present trend towards miniaturization resulted in flip-chip mounted chips. Such chips are electrically and mechanically connected to the carrying substrate via bump connections. Electrical connections between different chips are realized by conducting structures such as signal lines that are attached to the substrate or buried in a multilayer substrate. The application of flip-chip bonding allows a further step in miniaturization. However, in contrast to bond wires, the electrical insulation of signal lines that are attached to the substrate is reduced due to the direct contact between the substrate and the signal line.

In one embodiment, the substrate comprises two dielectric layers and a metallization layer between the two dielectric layers. At least a section of the signal line is arranged within the metallization layer between the two dielectric layers. Such a substrate is known as a multilayer substrate. In multilayer substrates, the isolation between signal lines and conducting structures can be improved by embedding the signal line into the body of the multilayer substrate. Therefore, signal lines and other conducting structures can be structured in metallization layers. Further circuit elements such as resistive elements, capacitive elements or inductive elements can either be mounted to the surface of the substrate via flip chip connections or via surface mount device (SMD) connections or can be integrated into the substrate, too.

In one embodiment, the MEMS microphone further comprises a DC guard structure fencing at least a section of the signal line towards adjacent conducting structures having a DC potential different from the DC bias voltage.

It was found that the leakage current through the insulation resistance and thus the noise signal of a miniaturized MEMS microphone can be significantly reduced by providing a DC guard structure.

A DC guard structure acts as a buffer and provides an environment of the respective section of the signal line that has mainly the same DC potential like the signal line. As a result, there is virtually no DC potential difference between the respective section of the signal line and its environment. Thus, the DC leakage current through the insulating resistance and as a consequence thereof the noise signal too are practically eliminated.

For that purpose, the DC guard structure may be provided at locations, where the signal line faces an adjacent conducting structure having a potential different from the DC bias voltage. Then, the DC guard structure is useful in particular, when the methods mentioned above can not be applied. From this, it is obvious, that the DC guard structure must not necessarily be a closed surrounding of the signal line. Rather, it may be applied like a fence between approaching spots or edges of signal line and said conducting structures, respectively.

In one embodiment, the substrate comprises a material selected from an FR-4 material (as designated by the National Electrical Manufacturers Association or NEMA), an FR-5 material (as designated by NEMA), polytetrafluoroethylene, and a glass fiber reinforced material.

In a further variant of the invention, a MEMS microphone is provided that comprises a MEMS transducer having a signal output, an IC chip having a signal input, a substrate, a signal line, and a DC guard structure. The MEMS transducer and the IC chip are arranged on the substrate. The signal line electrically connects the signal output of the MEMS transducer with the signal input of the IC chip. A DC bias voltage is provided during operation by the IC-chip to the MEMS-transducer via the signal line. The DC guard structure fences at least a section of the signal line towards adjacent conducting structures having a DC potential different from the DC bias voltage.

The signal line can electrically connect either the flexible or movable membrane of the MEMS transducer with a signal amplifier of the IC chip or the back plate of the MEMS transducer with the signal amplifier of the IC chip. During operation of the MEMS microphone, a DC bias voltage can be applied to the signal line and also to the MEMS capacitor of the MEMS transducer. For that purpose, the IC chip can be an ASIC chip (ASIC=Application Specific Integrated Circuit). The IC chip can comprise a charge pump or any other adequate circuit for providing the DC bias voltage. The charge pump CP can provide its DC bias voltage via a resistive element $R_{bias}$. The resistance of the resistive element $R_{bias}$ can be in the range of 10 GΩ.

The IC chip can further comprise a DC bias port that is directly connected to the charge pump. The resistive element can be electrically connected between the signal input of the IC chip and the DC bias port of the IC chip. The DC guard structure can be electrically connected to the DC bias port. This means that the same DC voltage is supplied to the DC guard structure. However, as the DC guard structure and the signal line are separated by the resistive element, the DC guard structure acts as a buffer and provides an environment for the respective section of the signal line that has mainly the same DC potential. As a result, there is virtually no DC potential difference between the respective section of the signal line and its environment. Thus, the DC leakage current through the insulating resistance and as consequence the noise signal is practically eliminated.

In one embodiment of this variant, the IC chip comprises a signal amplifier, a resistive bias element and a DC bias voltage source. The MEMS-transducer is connected to the DC bias voltage source via the resistive bias element. The DC guard structure is electrically connected to the charge pump. Further, the DC guard structure may be directly connected to the charge pump being a preferred DC bias voltage source.

In one embodiment, the DC guard structure comprises a conducting material. A section of the signal line is arranged above or below the DC guard structure.

In one embodiment, the substrate comprises two dielectric layers, a metallization layer between the two dielectric layers and an upper and a lower metallization layer of the DC guard structure. A section of the signal line is arranged within the metallization layer. The section of the signal line is arranged between the upper metallization and the lower metallization of the DC guard structure.

Thus, a further improved guarding effect is achieved by embedding the respective signal line between the upper metallization and the lower metallization of the DC guard structure. In a respective multilayer substrate, there is practically no further space required for the DC guard structure as the DC guard structure components can be embedded in the multilayer substrate.

In one embodiment, the DC guard structure comprises a metallization that is arranged annularly, but not necessarily circular or closed, around the signal line. The signal line and the metallization of the DC guard structure can be arranged on the surface of the substrate. Then, the metallization of the DC guard structure and the signal line are arranged in the same metallization layer.

However, it is possible that the metallization of the DC guard structure and the signal line are arranged within different metallization layers of a multilayer substrate. The DC guard structure can have a tube like shape and the signal line or a section of the signal line can be arranged within the tube shaped DC guard structure.

In one embodiment, the MEMS microphone further comprises an electromagnetic shielding structure that shields a section of the signal line.

In one embodiment, the electromagnetic shielding structure shields a section of the DC guard structure, i.e. the DC guard structure or at least a section of the DC guard structure is embedded within the electromagnetic interference shielding structure.

In one embodiment, the substrate comprises a material selected from a FR-4 material, a FR-5 material, polytetrafluoroethylene, and a glass fiber re-inforced material.

In one embodiment the substrate comprises a material selected from high temperature cofired ceramic, low temperature cofired ceramic, and glass.

In a further variant, a MEMS microphone comprises a MEMS transducer having a signal output, an IC chip having a signal input, a substrate, a signal line, and a conducting structure. The MEMS transducer and the chip are arranged on the substrate. The signal line electrically connects the signal output of the MEMS transducer with the signal input of the IC chip. A DC bias voltage is provided by the IC-chip to the MEMS-transducer via the signal line. The signal line and the conducting structure are electrically isolated.

DETAILED DESCRIPTION OF THE INVENTION

For clarity, parts that are not relevant for the invention are not shown in the figures, even if they might be essential for the function of the MEMS microphone, e.g. housing, acoustic port, external terminals and the like.

Figure 1:
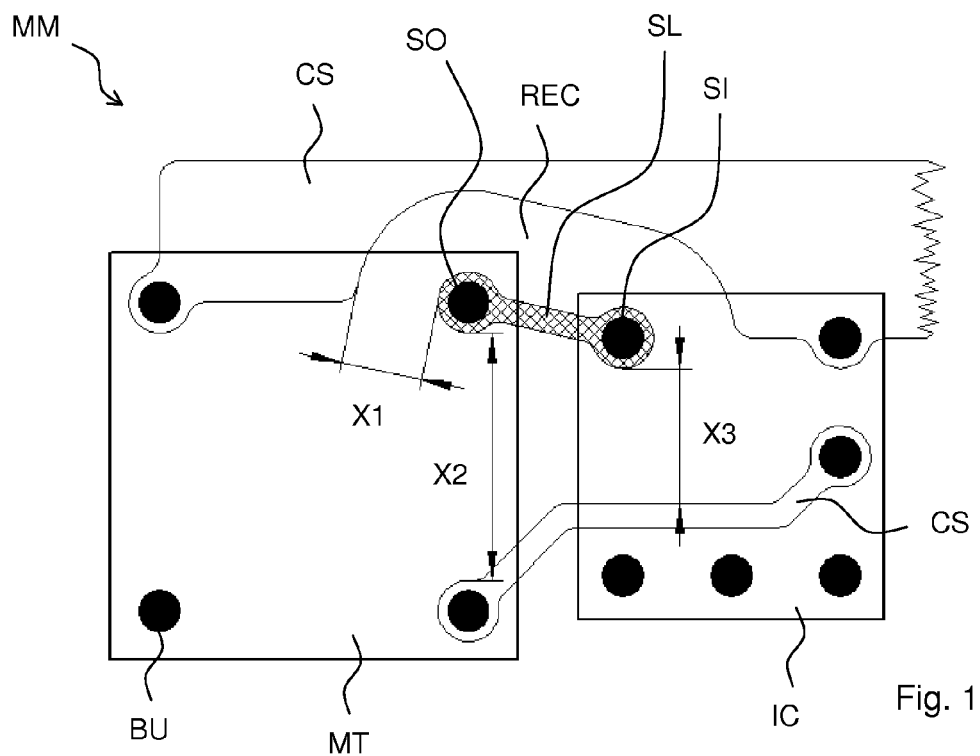
FIG. 1 shows a transverse cross-section of a MEMS microphone having a recess in a conducting structure.

FIG. 1 shows a transverse cross-section of a MEMS microphone MM. The MEMS microphone MM comprises a MEMS transducer MT and an IC chip IC. The MEMS transducer MT and the IC chip IC are electrically connected by two conducting structures CS and a signal line SL. The signal line SL electrically connects a signal output SO of the transducer MT and a signal input SI of the IC chip IC, respectively. The conducting structures CS also electrically connect the MEMS transducer MT and the IC chip IC. The conducting structures CS may comprise a connection to ground or may comprise a further signal or power supply conducting structure.

The conducting structure CS shown in the upper section of FIG. 1 comprises a recess REC. The shape of the recess REC is arranged in such a way that the distance between the signal line SL and the conducting structure CS or between signal input SI or signal output SO ports and the conducting structures keeps exceeding a certain minimum value indicated by a distance, x1. Further, the signal line SL and the conducting structure shown in the lower section of FIG. 1 are arranged in such a way that a minimum distance is maintained as indicated by distances x2 and x3. These distances are just examples. More generally, the lateral distance from any point of the signal line to any point of a conducting structure having an other potential than $U_{bias}$ is implied. In any case, this distance has to be 200 µm at least, more preferably 500 µm at least. The recess REC is just an example of various possible layouts intended to fulfill the above condition.

As a result of these minimum distances, the effective resistance between the signal line SL and further conducting structures CS is increased. Such minimum distances do not significantly counteract the trend towards miniaturization if respective recesses of the conducting structures or arrangements of the conducting structures are chosen properly.

Figure 2:
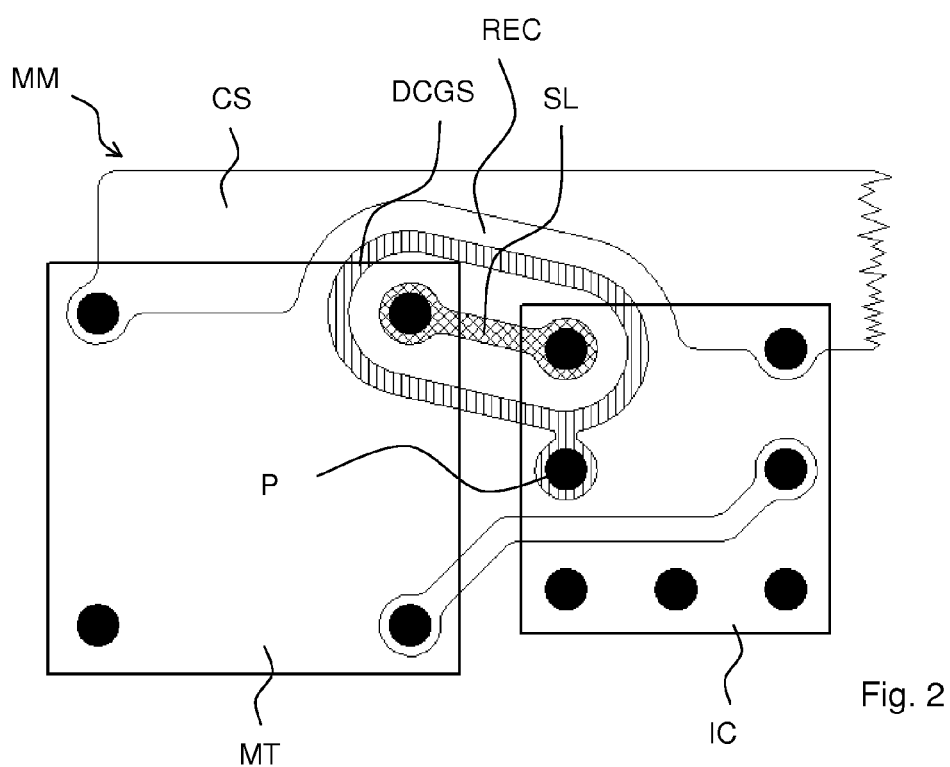
FIG. 2 shows a transverse cross-section of a MEMS microphone having a DC guard structure.

FIG. 2 shows a transverse cross-section of a MEMS microphone MM comprising a DC guard structure DCGS and the upper conducting structure CS of FIG. 1. The DC guard structure DCGS annularly surrounds the signal line SL completely or to some extent at least within a plane parallel to the substrate so that the DC guard structure DCGS is at least partially arranged within a recess in the upper conducting structure CS. The DC guard structure DCGS is electrically connected to a further port P of the IC chip IC. The DC guard structure DCGS reduces the leakage current between the signal line SL and further surrounding conducting structures CS. Due to this effect, it is no longer necessary to keep the above minimum distances. Further, since there are no limits for the distance between guarding structure and other conducting structures like shielding, the layout is simplified. Again, the recess is just a layout example for possible arrangements.

Figure 3:
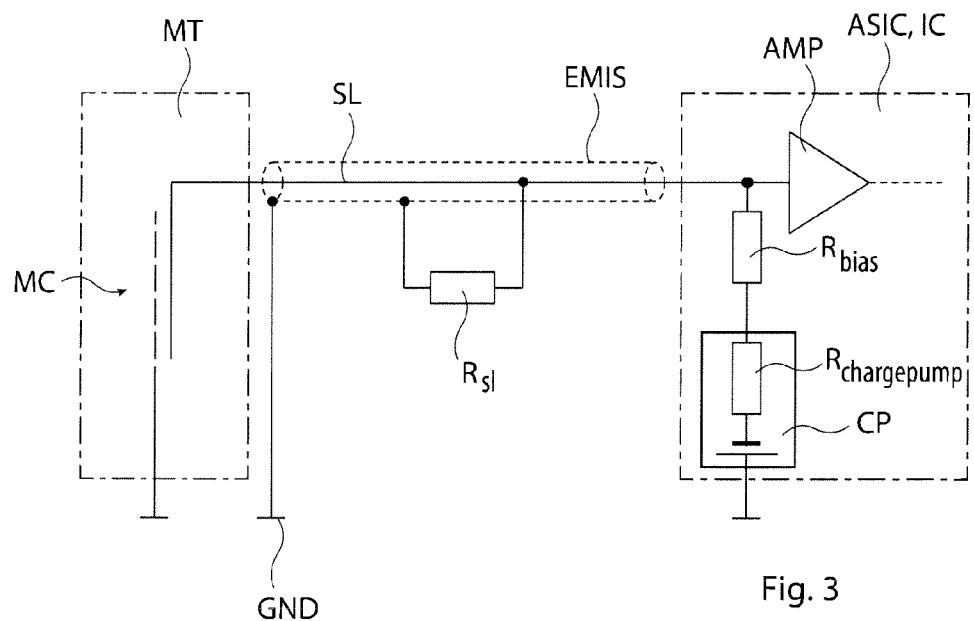
FIG. 3 shows an equivalent circuit diagram of a MEMS microphone having an electromagnetic interference shielding structure.

FIG. 3 shows an equivalent circuit diagram of a MEMS microphone comprising a MEMS capacitor MC in the MEMS transducer MT and a signal amplifier AMP in the IC chip IC. The signal amplifier AMP is part of an ASIC (ASIC=Application Specific Integrated Circuit) which is integrated in the IC chip IC. The ASIC further comprises a voltage source which may be a charge pump CP. The charge pump CP has an intrinsic resistance $R_{chargepump}$.

The ASIC further comprises a biasing resistance element $R_{bias}$. By means of the charge pump CP, the membrane of the MEMS capacitor MC is held at a certain working voltage which may be in the range of 10 V. An electromagnetic interference shielding structure EMIS shields at least a section of the signal line SL that electrically connects the MEMS transducer MT with the IC chip IC. In this embodiment, the electromagnetic interference shielding structure EMIS is electrically connected to ground. The resistance element $R_{SL}$ is virtual only and represents the resistance of the imperfect DC insulation of the signal line SL. Although the electromagnetic interference shielding structure EMIS augments a protection against electromagnetic signals such as radio frequency signals, the electromagnetic interference shielding structure EMIS in general does not improve the DC insulation of the signal line.

Figure 4:
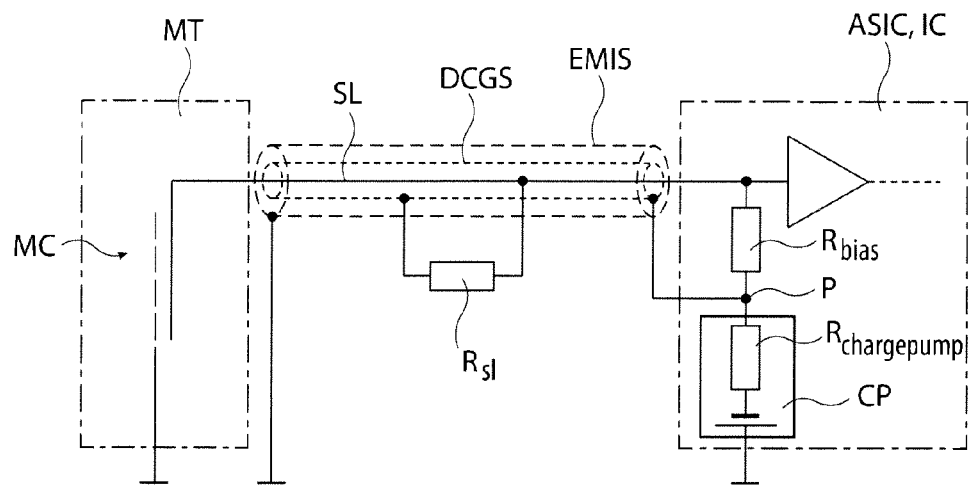
FIG. 4 shows an equivalent circuit diagram of a MEMS microphone having an electromagnetic interference shielding structure and a DC guard structure.

For that a DC guard structure DCGS is provided as can be seen in FIG. 4. FIG. 4 shows a—schematic—equivalent circuit diagram of a MEMS microphone where a section of the signal line SL is surrounded by the DC guard structure DCGS. The DC guard structure DCGS is electrically connected to the charge pump of the ASIC. Thus, the DC guard structure DCGS is mainly kept at the same DC potential as the signal line SL. However, the resistive element $R_{bias}$ between the charge pump CP and the signal line SL buffers changes of the necessary voltage between the signal line and the DC guard structure DCGS, respectively. As the signal line and the DC guard structure DCGS are mainly on the same DC potential, the flow of leakage currents from the signal line is suppressed and the resistive element $R_{SL}$ cannot deteriorate the quality of the signals propagating in the signal line SL anymore. The noise level of the MEMS microphone is reduced.

Further, the electromagnetic interference shielding structure EMIS protects the DC guard structure DCGS and the signal line SL respectively from high-frequency distortions.

Figure 5:
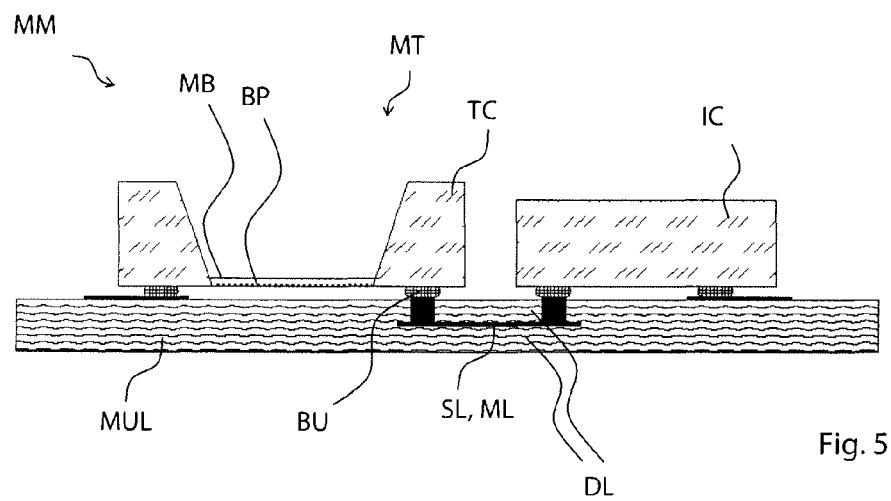
FIG. 5 shows a sagittal cross-section of a MEMS microphone comprising a multilayer substrate.

FIG. 5 shows a sagittal cross-section of a MEMS microphone MM. The microphone MM comprises a multilayer substrate MUL, a MEMS transducer MT and an IC chip IC. The MEMS transducer MT and the IC chip IC are arranged on the surface of the multilayer substrate MUL. The multilayer substrate MUL comprises two dielectric layers DL. Between the dielectric layers DL a metallization layer ML is arranged. Within the metallization layer ML, a signal line SL is structured. The signal line electrically connects bump connections of the MEMS transducer MT and the IC chic IC by means of vias in the multilayer substrate MUL.

The MEMS transducer MT comprises a transducer chip TC. The transducer chip TC comprises a flexible or movable membrane MB and a back plate BP which establish the MEMS capacitor of the MEMS transducer MT.

As the signal line SL is integrated within the multilayer substrate MUL, the electric isolation of the signal line is improved. Especially surface leakage currents are reduced.

Figure 6:
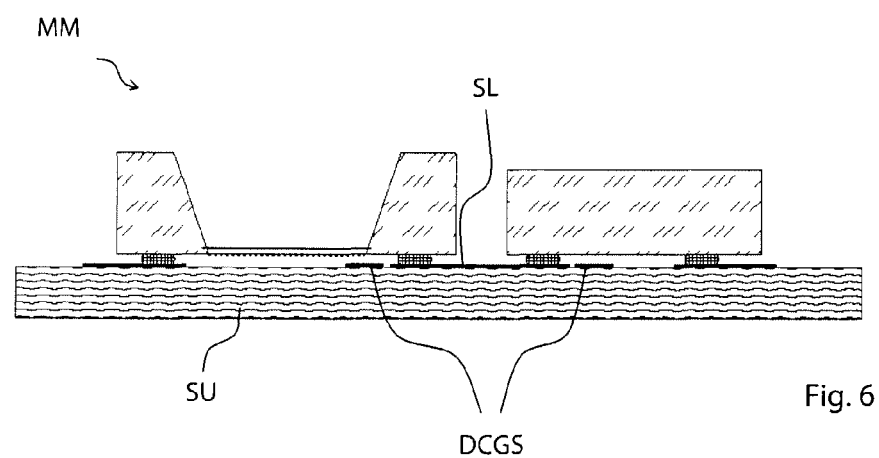
FIG. 6 shows a sagittal cross-section of a MEMS microphone having a signal line on the surface of a substrate.

FIG. 6 shows a sagittal cross-section of a MEMS microphone MM where the signal line SL is arranged on the surface of a substrate SU. The sagittal cross-section shows two sections of a DC guard structure DCGS that annularly surrounds the signal line SL and that is arranged on the surface of the substrate SU.

The present invention comprises means for reducing DC leakage currents from a signal line of a MEMS microphone. The basic concept of the invention does not depend on details such as geometric details concerning the DC guard structure or the layout of signal lines and conducting structures. Further, the invention is not restricted by the variants or embodiments or the accompanying figures. Especially embodiments based on different geometric configurations are also possible. For example: the signal line can be arranged on or in the substrate. Thus, numerous variations departing from the figures are possible without departing from the invention.

What is claimed is:

1. A MEMS-microphone comprising a MEMS-transducer having a signal output, an IC-chip having a signal input, a substrate, a signal line, a conducting structure, and a bump connection between the substrate and the MEMS-transducer or between the substrate and the IC-chip forming a part of the signal line; where
   the MEMS-transducer and the IC-chip are arranged on the substrate,
   the signal line electrically connects the signal output of the MEMS-transducer with the signal input of the IC-chip,
   a DC bias voltage is provided by the IC-chip to the MEMS-transducer via the signal line,
   the conducting structure is electrically connected to a DC potential different from the DC bias voltage, and
   a minimum lateral distance between the signal line and the conducting structure is kept of at least 200 μm.

2. The MEMS-microphone of claim 1, where the lateral distance between the signal line and the conducting structure is at least 500 μm.

3. The MEMS-microphone of claim 1, where the conducting structure comprises an area having a recess in the vicinity of the signal line for maintaining a minimum distance between the conducting structure and the signal line.

4. The MEMS-microphone of claim 1, where
   the MEMS-microphone has an electromagnetic shielding potential, and
   the conducting structure is electrically connected to the electromagnetic shielding potential.

5. The MEMS-microphone of claim 1, where
   the MEMS-microphone has a ground potential and
   the conducting structure is electrically connected to the ground potential.

6. The MEMS-microphone of claim 1, where
   the substrate comprises two dielectric layers and a metallization layer between the two dielectric layers, and
   a section of the signal line is arranged within the metallization layer.

7. The MEMS-microphone of claim 1, further comprising a DC guard structure fencing a section of the signal line towards adjacent conducting structures having a DC potential different from the DC bias voltage.

8. The MEMS-microphone of claim 1, where the substrate is an organic laminate comprising a material that includes an FR-4 material, an FR-5 material, polytetrafluoroethylene, or a glass fiber reinforced material.

9. The MEMS-microphone of claim 1, where the substrate comprises a material that includes a high temperature cofired ceramic, low temperature cofired ceramic, or glass.

10. The MEMS-microphone of claim 1, wherein a section of the signal line is arranged within the substrate in the form of a metallization layer or on a surface of the substrate.

11. A MEMS-microphone, comprising a MEMS-transducer having a signal output, an IC-chip having a signal input, a substrate, a signal line, a bump connection between the substrate and the MEMS-transducer or between the substrate and the IC-chip forming a part of the signal line, and a DC guard structure; where
the MEMS-transducer and the IC-chip are arranged on the substrate,
the signal line electrically connects the signal output of the MEMS-transducer with the signal input of the IC-chip,
a DC bias voltage is provided by the IC-chip to the MEMS-transducer via the signal line, and
the DC guard structure fences a section of the signal line towards adjacent conducting structures having a DC potential different from the DC bias voltage.

12. The MEMS-microphone of claim 11, further comprising a signal amplifier, a resistive bias element, and a DC bias source; where
the MEMS-transducer is connected to the DC bias voltage via the resistive bias element, and
the DC guard structure is electrically connected to the DC bias source.

13. The MEMS-microphone of claim 11, where the DC guard structure comprises a conducting material and a section of the signal line is arranged above or below the DC guard structure.

14. The MEMS-microphone of claim 11, where
the substrate comprises two dielectric layers, a metallization layer between (a) the two dielectric layers and (b) an upper and a lower metallization layer of the DC guard structure,
a section of the signal line is arranged within the metallization layer, and
the section of the signal line is arranged between the upper metallization and the lower metallization of the DC guard structure.

15. The MEMS-microphone of claim 11, where the DC guard structure comprises a metallization that is arranged annularly around the signal line.

16. The MEMS-microphone of claim 11, where the substrate is an organic laminate comprising a material that includes an FR-4 material, an FR-5 material, polytetrafluoroethylene, or a glass fiber reinforced material.

17. The MEMS-microphone of claim 11, further comprising an electromagnetic shielding structure shielding a section of the signal line.

18. The MEMS-microphone of claim 17, where the electromagnetic shielding structure shields a section of the DC guard structure.

19. A MEMS-microphone, comprising a MEMS-transducer having a signal output, an IC-chip having a signal input, a substrate, a signal line, a bump connection between the substrate and the MEMS-transducer or between the substrate and the IC-chip forming a part of the signal line, and a conducting structure; where
the MEMS-transducer and the IC-chip are arranged on the substrate,
the signal line electrically connects the signal output of the MEMS-transducer with the signal input of the IC-chip,
a DC bias voltage is provided by the IC-chip to the MEMS-transducer via the signal line, and
the signal line and the conducting structure are electrically isolated.

* * * * *